(12) United States Patent
Chen et al.

(10) Patent No.: US 7,323,718 B2
(45) Date of Patent: Jan. 29, 2008

(54) INPUT DISPLAY WITH EMBEDDED PHOTO SENSOR

(75) Inventors: Po-Yang Chen, Tao-Yuan Hsien (TW); Po-Sheng Shih, Tao-Yuan Hsien (TW); Wei-Chou Chen, Tao-Yuan Hsien (TW); Kei-Hsiung Yang, Tao-Yuan Hsien (TW)

(73) Assignee: Hannstar Display Corporation, Yang-Mei, Tao-Yuan Hsien (TW)

( * ) Notice: Subject to any disclaimer, the term of this patent is extended or adjusted under 35 U.S.C. 154(b) by 100 days.

(21) Appl. No.: 11/415,776

(22) Filed: May 2, 2006

(65) Prior Publication Data

US 2007/0257259 A1   Nov. 8, 2007

(51) Int. Cl.
*H01L 29/04*   (2006.01)
*H01L 31/036*  (2006.01)
*H01L 27/10*   (2006.01)
*H01L 31/062*  (2006.01)
*H01L 31/113*  (2006.01)

(52) U.S. Cl. .................. 257/72; 257/292; 257/202; 257/347

(58) Field of Classification Search ............ 257/66–72, 257/202–206, 290–294, 347
See application file for complete search history.

(56) References Cited

U.S. PATENT DOCUMENTS

2007/0187720 A1 *  8/2007  Park et al. .................. 257/206

* cited by examiner

*Primary Examiner*—Cuong Nguyen
(74) *Attorney, Agent, or Firm*—Volpe and Koenig P.C.

(57) ABSTRACT

A readout pixel of an input display is provided. The readout pixel includes the fundamental elements as the normal pixel, and further includes a photo sensing element with a second switching element and a third switching element for generating a photo signal. The second switching element includes a second gate electrode connecting to a gate line, a second drain electrode, and a second source electrode connecting to a readout line. The third switching element includes a third gate electrode and a third drain electrode both connecting to a reference voltage, and a third source electrode connecting to the second drain electrode.

20 Claims, 15 Drawing Sheets

INPUT DISPLAY WITH EMBEDDED PHOTO SENSOR

FIELD OF THE INVENTION

The present invention relates to a liquid crystal display, and more specifically to a liquid crystal with the photo sensors embedded therein.

BACKGROUND OF THE INVENTION

With the photosensitivity of the amorphous silicon, input displays are provided with the embedded photo sensing elements formed thereby. Since the process of the amorphous silicon photo sensing elements and the readout circuit layout of an input display are compatible with the known process of the thin film transistor array of the active matrix liquid crystal display, the manufacturing cost of the input display with embedded amorphous silicon device as the photo sensor is more competitive than the known input display with a sensitive film attached thereon.

Furthermore, the optical transmittance of the input display with the sensitive film would be degraded by 20%; while the optical transmittance of the input display with amorphous silicon as the photo sensing elements is only dependent on the layout of the photo sensing elements and the readout line in each readout pixel. Therefore, if the photo sensing elements and circuit layout in each pixel are well designed, the aperture ratio in each pixel of the input display is rarely affected.

Please refer to FIG. 1 which schematically shows a detailed layout of a photo sensing element in a readout pixel of an input display according to the prior art. As can be seen from FIG. 1, the photo sensing element includes a photo TFT 121 as a photo sensor for generating a photo current transmitted through a switch TFT 122 and then read out through the transmission of the readout line. The drain and gate terminals D, G of the photo TFT 121 are connected to a bias voltage, and the source terminal S of the photo TFT 121 is connected to the readout line of the readout pixel through the switch TFT 122. As can be seen from FIG. 1, the drain terminal D of the switch TFT 122 is connected to the source terminal S of the photo TFT 121, and the gate and source terminals G, S of the switch TFT 122 are connected to a gate line of and the readout line of the readout pixel, respectively.

Furthermore, please refer to FIGS. 2(A) and 2(B), which shows the layout of the connecting pads, such as gate pads, data pads and readout pads on the substrate of a liquid crystal display. As can be seen from FIG. 2(A), the gate pads 55 and data pads 45 in a normal liquid crystal display are respectively arranged on two adjacent sides which are also called gate side and data side of the liquid crystal display. The gate pads 55 and data pads 45 are used for connecting each of the gate lines and data lines to the respective gate and data drivers, so that the gate signals and data signals from the respective gate and data drivers can be inputted into each gate line and data line for driving the active region of the display. However, in the input display, the readout lines are additionally provided for transmitting the photo signals generated by the photo sensing element of the input display, as can be seen from FIG. 2(B). Therefore, it is necessary to arrange an additional readout pads 35 for connecting each readout line to the readout IC(s) (not shown). If the number of readout lines are increased, it is necessary to arrange an additional margin area 33 on the substrate of the input display for disposing those readout pads 35, so that the bonding process of the readout IC can be carried out thereon. Since there will be the additional margin area 33 provided for the readout pads 35, the module process of the input display would be incompatible with the original module process of the liquid crystal display. Therefore, it is necessary to improve the layout of the readout line 31 and the readout pad 35 of the input display, so as to make the module process of the input display can be compatible with that of the original liquid crystal display.

Based on the above, it is the main aspect of the present invention to provide a novel layout design of an input display for simultaneously retaining the aperture ratio and enhancing the photosensitivity thereof.

SUMMARY OF THE INVENTION

It is a first aspect of the present invention to provide a liquid crystal display for simultaneously retaining the aperture ratio and enhancing the photosensitivity thereof. The liquid crystal display includes a gate line and a data line intersecting with each other, a readout line arranged parallel with the data line, a first switching element having a first gate electrode connecting to the gate line, a first drain electrode connecting to the data line, and a first source electrode connecting to a liquid crystal capacitor and a storage capacitor, both of which are connecting to a common voltage, a second switching element having a second gate electrode connecting to the gate line, a second drain electrode, and a second source electrode connecting to the readout line, and a third switching element having a third gate electrode and a third drain electrode, both of which are connecting to a reference voltage, and a third source electrode connecting to the second drain electrode.

Preferably, the common voltage and the reference voltage are interconnected with each other.

Preferably, the liquid crystal capacitor is formed by stacking a pixel electrode, a liquid crystal layer and a counter electrode, and the storage capacitor is formed by stacking the pixel electrode, a dielectric layer and a common electrode.

Preferably, the common electrode further includes a longitudinal part disposed near an edge of the pixel electrode and extending along the data line.

Preferably, the pixel electrode covering a part of the third drain electrode and a part of the third gate electrode.

Preferably, the pixel electrode covering a part of the third gate electrode and a part of third source electrode.

It is a second aspect of the present invention to provide a novel liquid crystal display for simultaneously retaining the aperture ratio and enhancing the photosensitivity thereof. The liquid crystal display includes a substrate having a plurality of first readout pixels and a plurality of second readout pixels formed thereon, a readout line pad arranged on a fringe area of the substrate, a gate line and a data line intersecting with each other, a first readout line paralleled with the data line and connecting the first readout pixels to the readout line pad, and a second readout line paralleled with the data line and connecting the second readout pixels to the readout line pad.

Preferably, the liquid crystal display further includes a gate pad arranged on the fringe area of the substrate.

Preferably, the liquid crystal display further includes a source pad arranged on the fringe area of the substrate.

Preferably, one of the first readout pixels further includes a first switching element having a first gate electrode connecting to the gate line, a first drain electrode connecting to the data line, and a first source electrode connecting to a liquid crystal capacitor and a storage capacitor, both of which are connecting to a common voltage, a second switching element having a second gate electrode connecting to the gate line, a second drain electrode, and a second source electrode connecting to the readout line, and a third switching element having a third gate electrode and a third drain electrode, both of which are connecting to a reference voltage, and a third source electrode connecting to the second drain electrode.

Preferably, the common voltage and the reference voltage are interconnected with each other.

It is a third aspect of the present invention to provide a novel liquid crystal display for simultaneously retaining the aperture-ratio and enhancing the photosensitivity thereof. The liquid crystal display includes a substrate including a first and a second insulating layers sequentially formed thereon and having a plurality of first readout pixels and a plurality of second readout pixels formed thereon, a first fan-out line disposed on the first insulating layer and linking up with a first readout line connecting with the first readout pixels, and a second fan-out line disposed on the second insulating layer and linking up with a second readout line connecting with the second readout pixels.

Preferably, the first insulating layer is a glass substrate.

Preferably, the first and the second fan-out lines are arranged approaching to an edge of the substrate.

Preferably, the liquid crystal display further includes a readout line pad arranged on a fringe area of the substrate.

Preferably, one of the first readout pixels further includes a first switching element having a first gate electrode connecting to the gate line, a first drain electrode connecting to the data line, and a first source electrode connecting to a liquid crystal capacitor and a storage capacitor both connecting to a common voltage, a second switching element having a second gate electrode connecting to the gate line, a second drain electrode, and a second source electrode connecting to the readout line, and a third switching element having a third gate electrode and a third drain electrode, both of which are connected to a reference voltage, and a third source electrode connected to the second drain electrode.

Preferably, the common voltage and the reference voltage are interconnected with each other.

It is a fourth aspect of the present invention to provide a novel liquid crystal display for simultaneously retaining the aperture ratio and enhancing the photosensitivity thereof. The liquid crystal display includes a gate line and a data line intersecting with each other, a readout line arranged parallel with the data line, a first switching element having a first gate electrode connecting to the gate line, a first drain electrode connecting to the data line, and a first source electrode connecting to a pixel electrode, a second switching element including a second gate electrode linking up with the gate line, a second drain electrode, and a second source electrode linking up with the readout line, and a third switching element connecting to the second drain electrode and containing a third gate electrode, a third drain electrode, and a third source electrode.

Preferably, the pixel electrode covering a part of the third gate electrode.

Preferably, the pixel electrode covering a part of the third drain electrode.

Preferably, the pixel electrode covering a part of the third source electrode.

The above objects and advantages of the present invention will become more readily apparent to those ordinarily skilled in the art after reviewing the following detailed descriptions and accompanying drawings, in which:

DETAILED DESCRIPTION OF A PREFERRED EMBODIMENT

The present invention will now be described more specifically with reference to the following embodiments. It should be noted that the following descriptions of preferred embodiments of this invention are presented herein for purposes of illustration and description only; it is not intended to be exhaustive or to be limited to the precise form disclosed.

Figure 1:
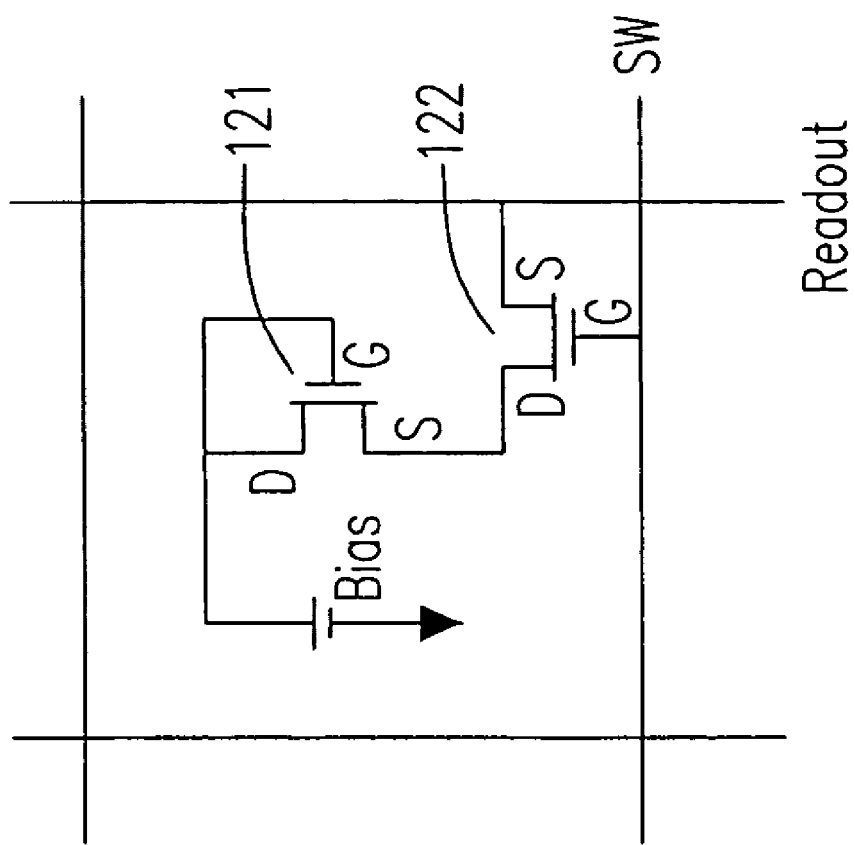
FIG. 1 schematically shows the equivalent circuit of a photo sensing element in a readout pixel of an input display according to the prior art.
Figure 2A:
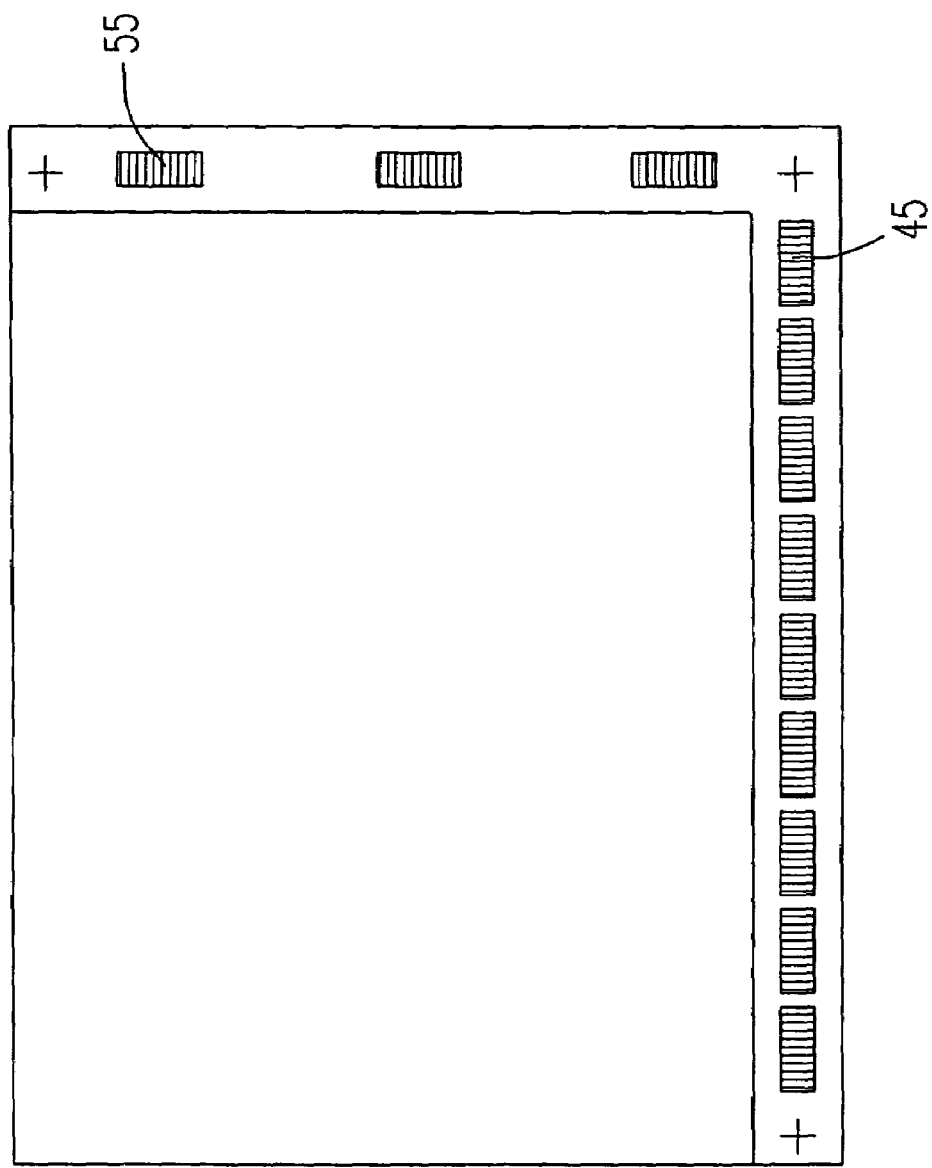
FIG. 2(A) is a diagram schematically illustrating the layout of the gate pads and data pads in an liquid crystal display according to the prior art.
Figure 2B:
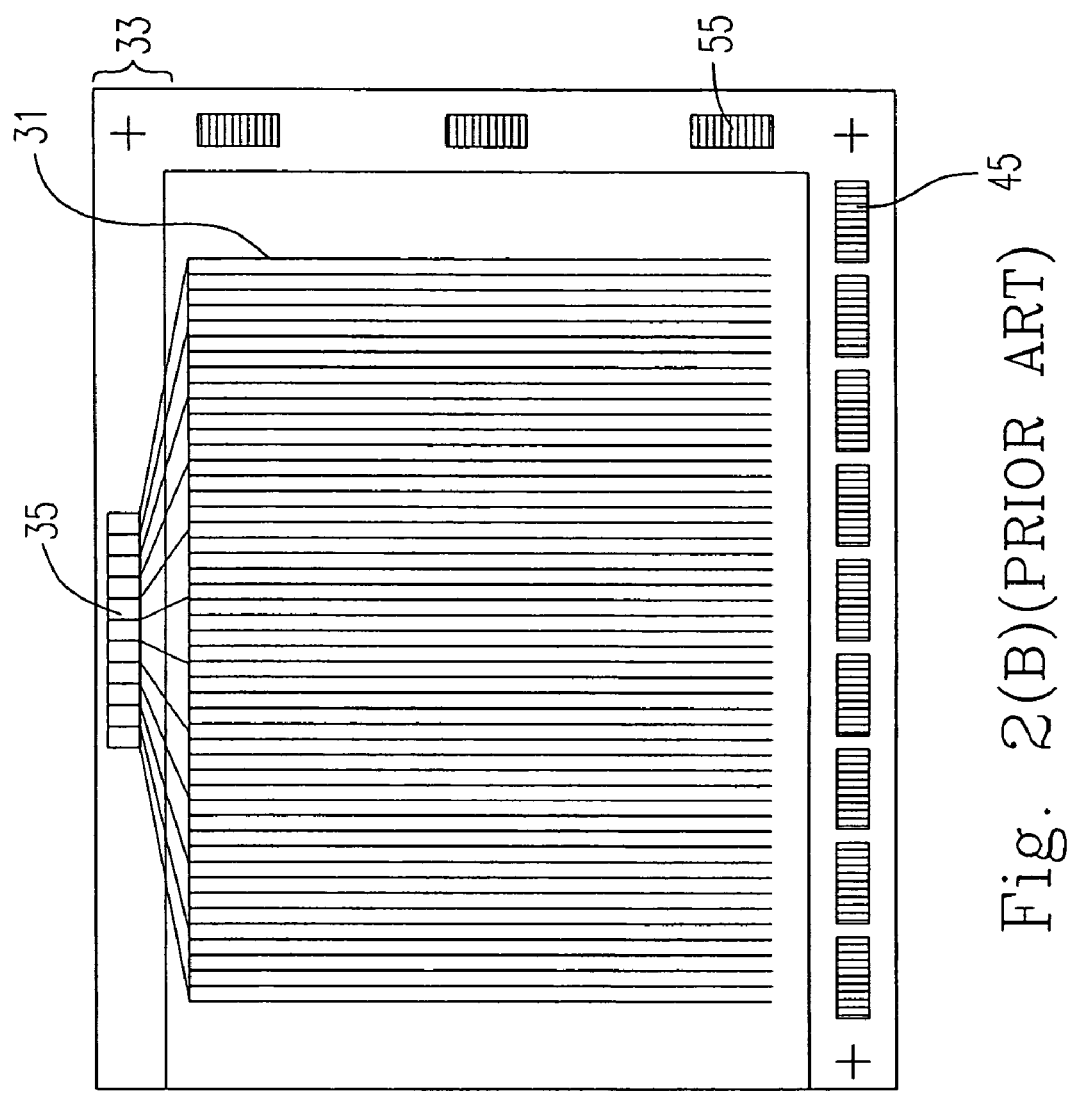
FIG. 2(B) is a diagram schematically illustrating the layout of the readout pad in an input display according to the prior art.
Figure 3A:
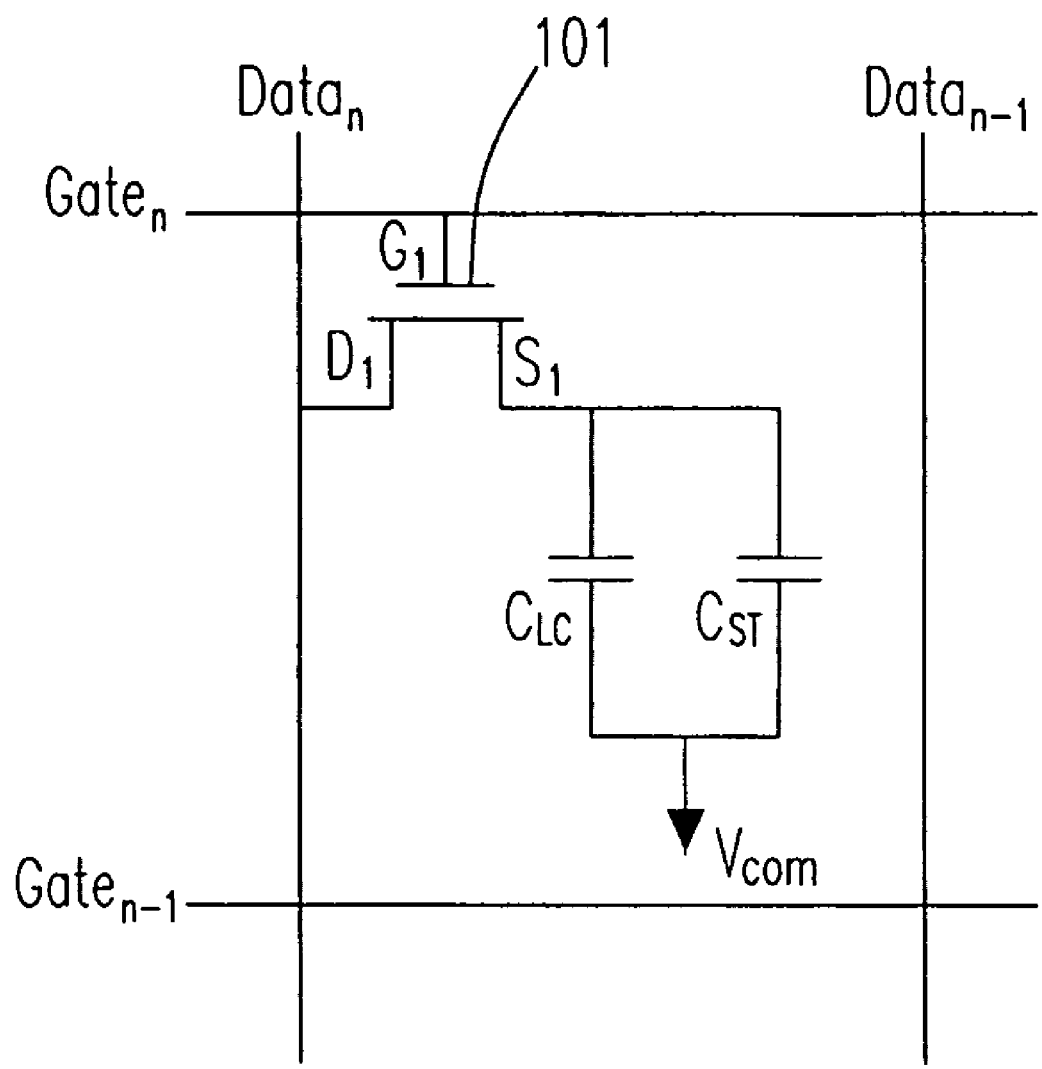
FIG. 3(A) and FIG. 3(B) respectively shows an equivalent circuit of a normal pixel and the readout pixel in an input display according to a preferred embodiment of the present invention.
Figure 3B:
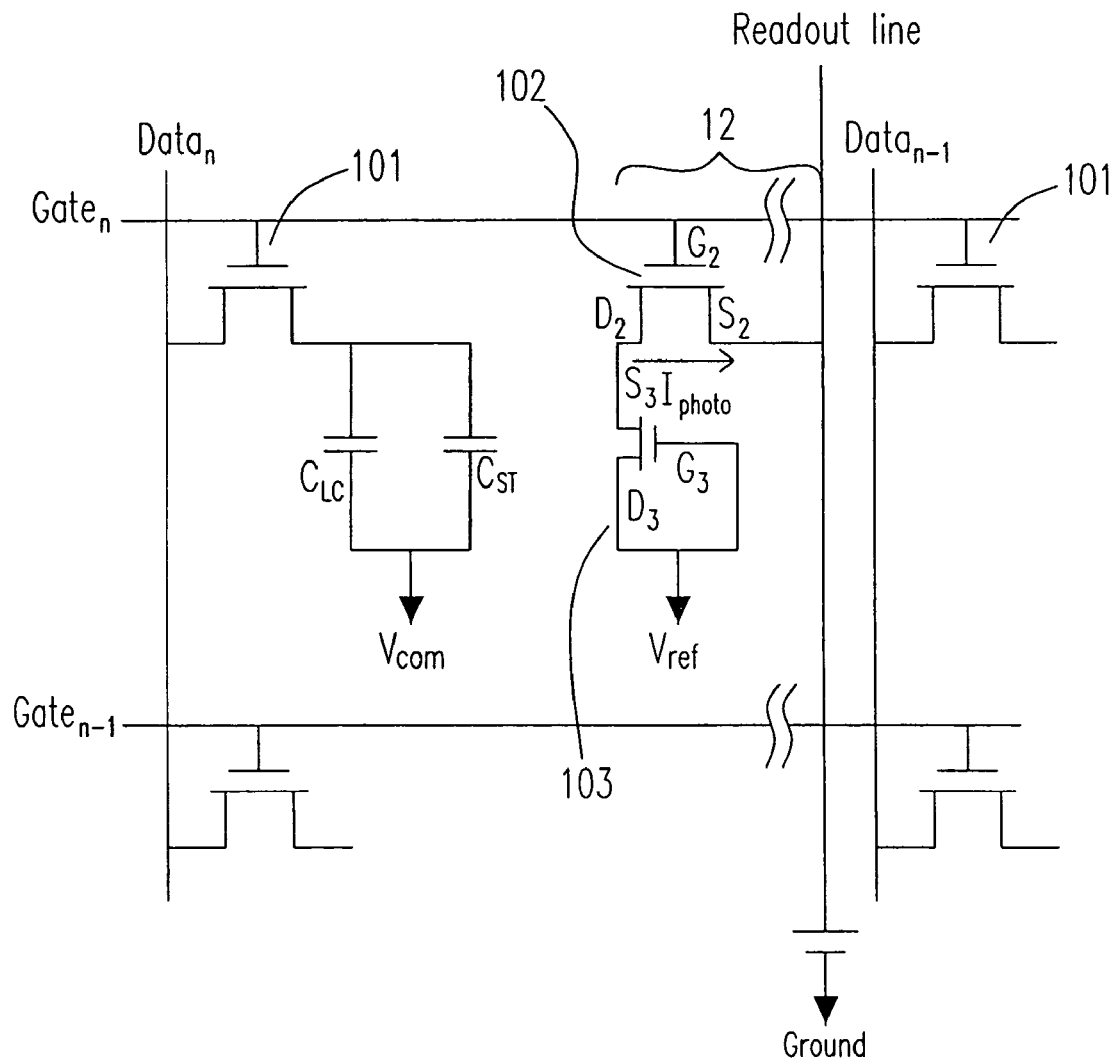

Please refer to FIGS. 3(A) and 3(B) which respectively shows an equivalent circuit of a normal pixel and the readout pixel in an input display according to a preferred embodiment of the present invention. Both the normal pixel and the readout pixel are applied in the input display. However, only the readout pixel can be used for generating the photo signals. As can be seen from FIG. 3(A), the normal pixel functioning as the original pixel used in the known liquid crystal display includes a pair of gate lines and a pair of data lines intersecting with each other, a first switching element 101 having a first gate electrode $G_1$ connecting to a first gate line $Gate_n$, a first drain electrode $D_1$ connecting to a first data line $Data_n$, and a first source electrode $S_1$ connecting to a liquid crystal capacitor $C_{LC}$ and a storage capacitor $C_{ST}$, both of which are connecting to a common voltage $V_{com}$. Comparing with the normal pixel, the readout pixel shown in FIG. 3(B) further includes a photo sensing element 12 for generating a photo signal which is transmitted through a readout line to the control system (not shown) of the input display for analyzing the address of the readout pixel generating the photo signal. Specifically, the photo sensing element 12 includes a second switching element 102 having a second gate electrode $G_2$ connecting to the first gate line $Gate_n$, a second drain electrode $D_2$, and a second source electrode $S_2$ connecting to the readout line, and a third switching element 103 having a third gate electrode $G_3$ and a third drain electrode $D_3$, both of which are connecting to a reference voltage $V_{ref}$, and a third source electrode $S_3$ connecting to the second drain electrode $D_2$. Although the normal pixel and the readout pixel are both used in the input display of the present invention, the main technical schemes of the present invention and the following embodiments will focus on the readout pixel only.

Figure 4A:
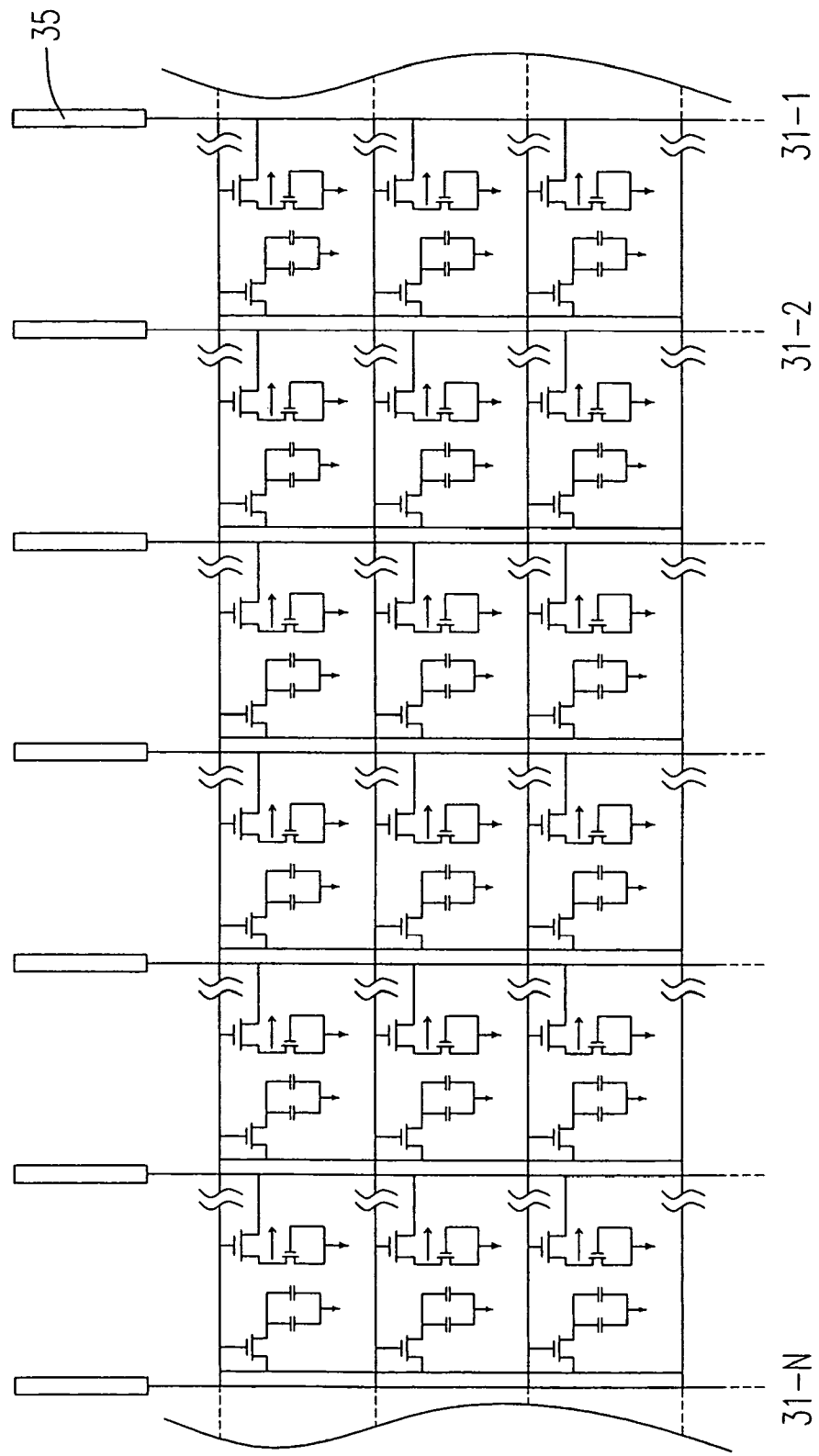
FIG. 4(A) is a diagram schematically illustrating the layout of the readout lines of an input display according to the prior art.

Please refer to FIG. 4(A), which shows the layout pattern of the readout lines in the input display according to an embodiment of the present invention. As can be seen from FIG. 4(A), each of readout lines 31-1, 31-2, . . . , 31-N passing through the corresponding readout pixel is connected to a respective readout pad 35. In such a layout, the photosensitive area in each readout pixel shall be large enough for generating a sufficient photo current transmitting to the readout pad 35.

Figure 4B:
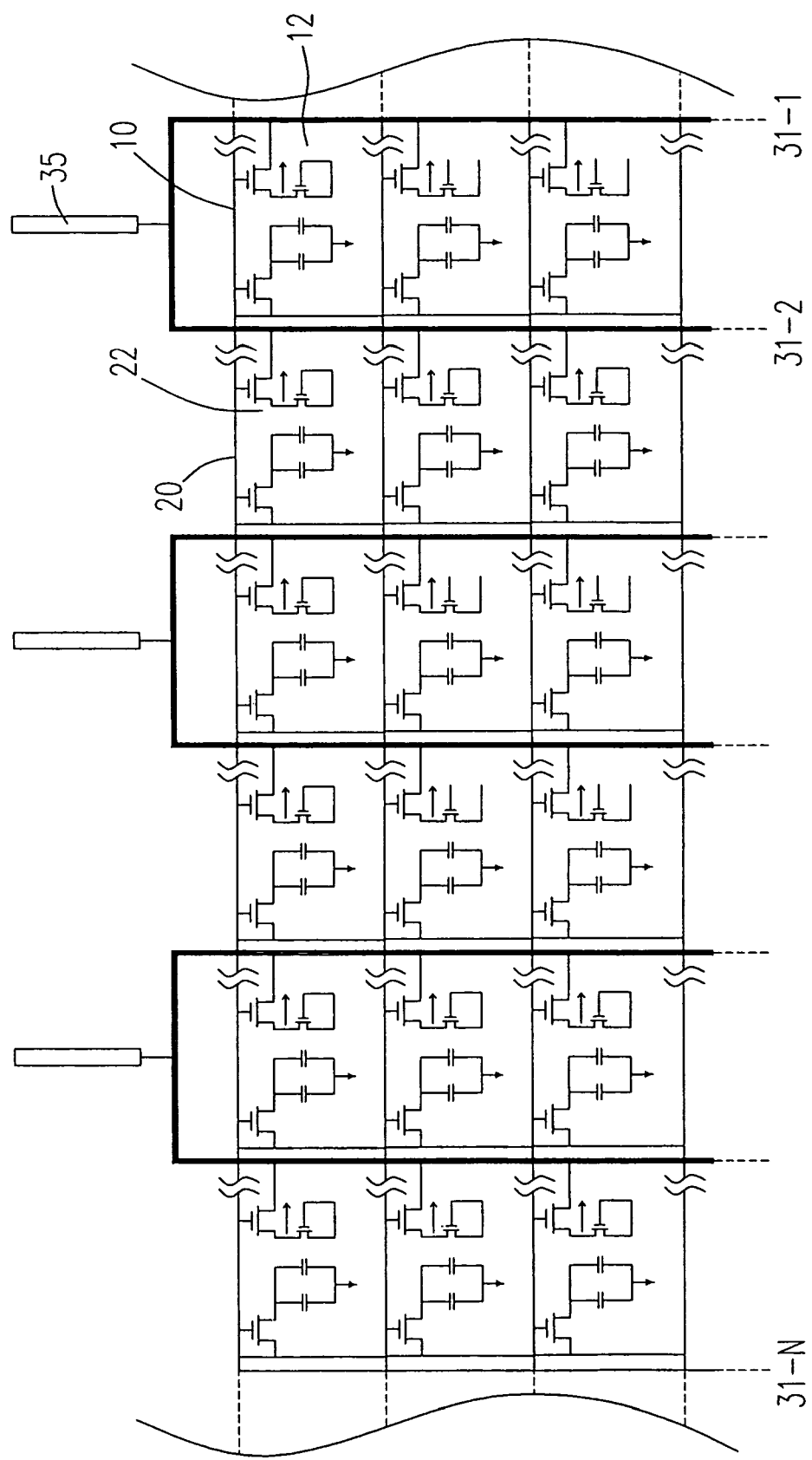
FIG. 4(B) is a diagram schematically illustrating the layout of the readout lines of an input display according to a preferred embodiment of the present invention.

Please refer to FIG. 4(B), which shows the layout of the readout lines in an input display according to a preferred embodiment of the present invention. Two sets of photo sensing elements 12, 22 disposed in two readout pixels 10, 20 are connected in parallel through a pair of readout lines 31-1, 31-2 which are interconnected to each other through a readout pad 35. With the layout of the first embodiment of the present invention, the photo currents generated in the two readout pixels 10, 20 are combined in the readout pad 35, so that the photo currents in each readout line can be decreased to achieve the function of power consumption.

Figure 5A:
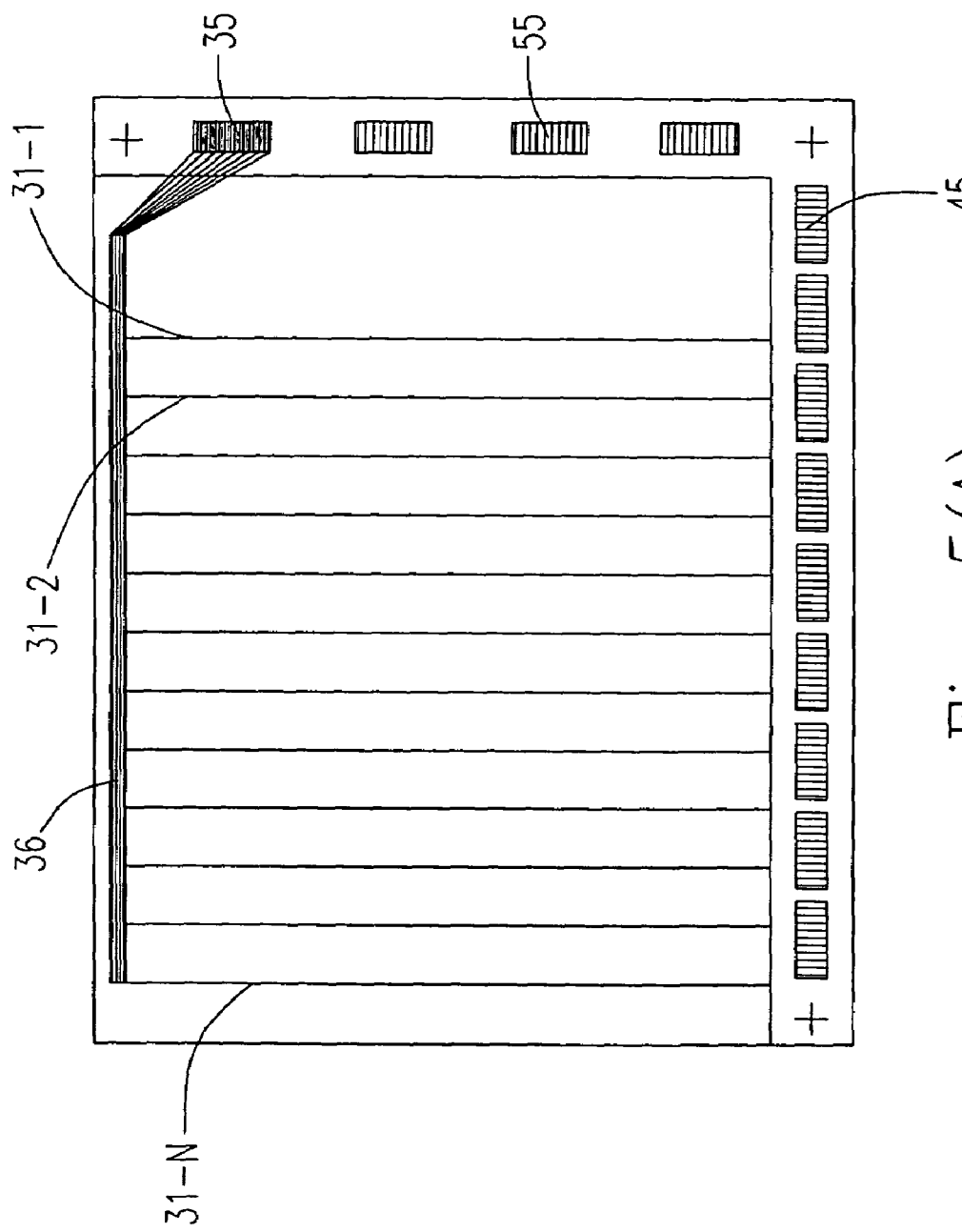
FIGS. 5(A) and 5(B) are the diagrams schematically illustrating the layout of the readout pad in an input display according to a preferred embodiment of the present invention.
Figure 5B:
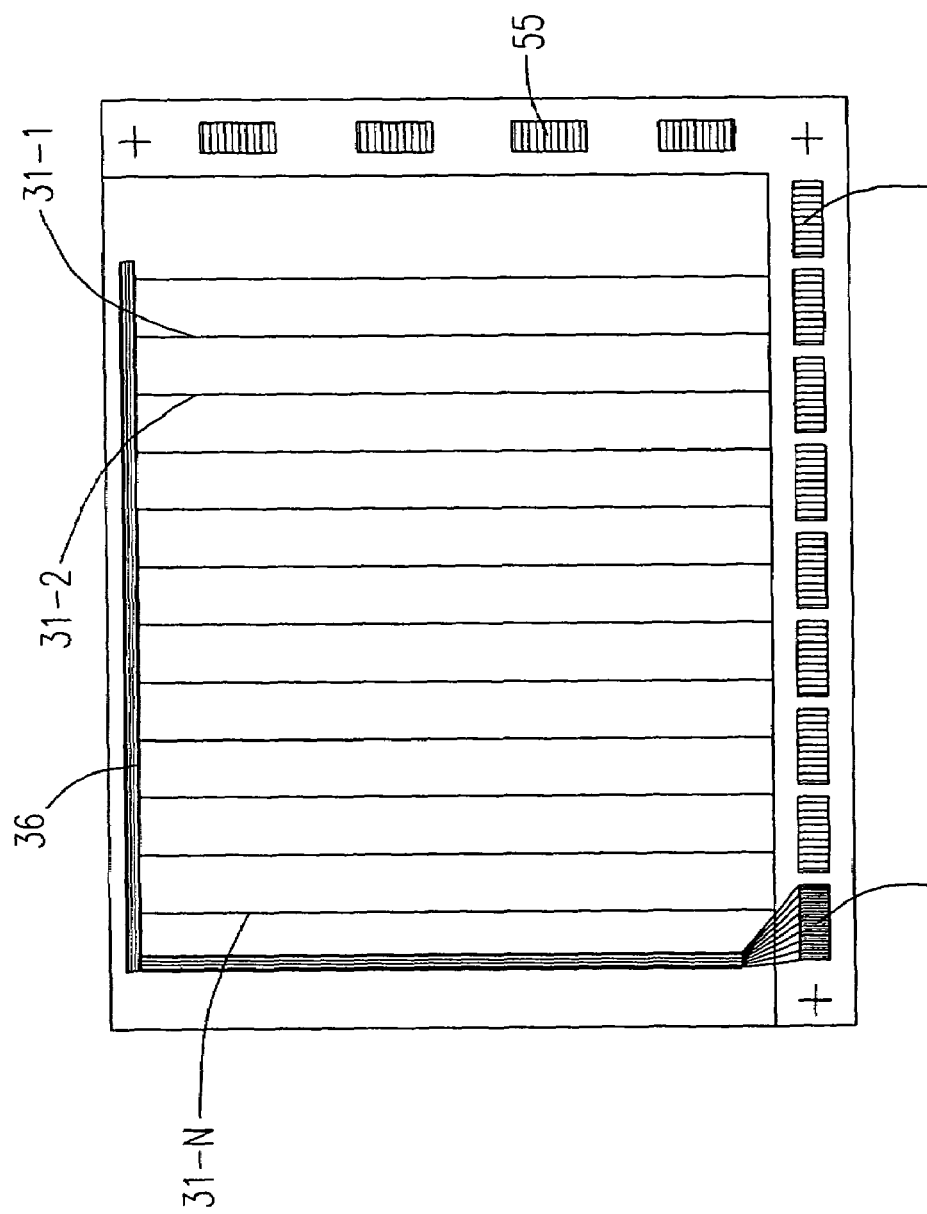

Furthermore, the layout of a preferred embodiment of the present invention also has another advantage in the module process and the cell process of the input display. Please refer to FIGS. 5(A) and 5(B), which schematically illustrates the layout of the readout pads 35 in an input display according to a preferred embodiment of the present invention. In the module process of the input display, each of the readout lines 31-1, 31-2, . . . , 31-N would be coupled to a printing circuit board (not shown) through at least one readout pad 35. Since two or more readout lines are connected in parallel, the numbers of the readout pads 35 can be halved or decreased, so that the area arranging the readout pads 35 in the fringe region of the substrate can be reduced. Therefore, the readout pads 35 can be disposed on the data pad 45 side or the gate pad 55 side of the substrate. Accordingly, the module process of the input display is compatible with the original module process of the liquid crystal display. Moreover, the cell sizes of the input display are not affected by the incorporation of the readout lines and readout pads, so that the cell process of the input display is also compatible with the original one of the liquid crystal display.

Figure 6A:
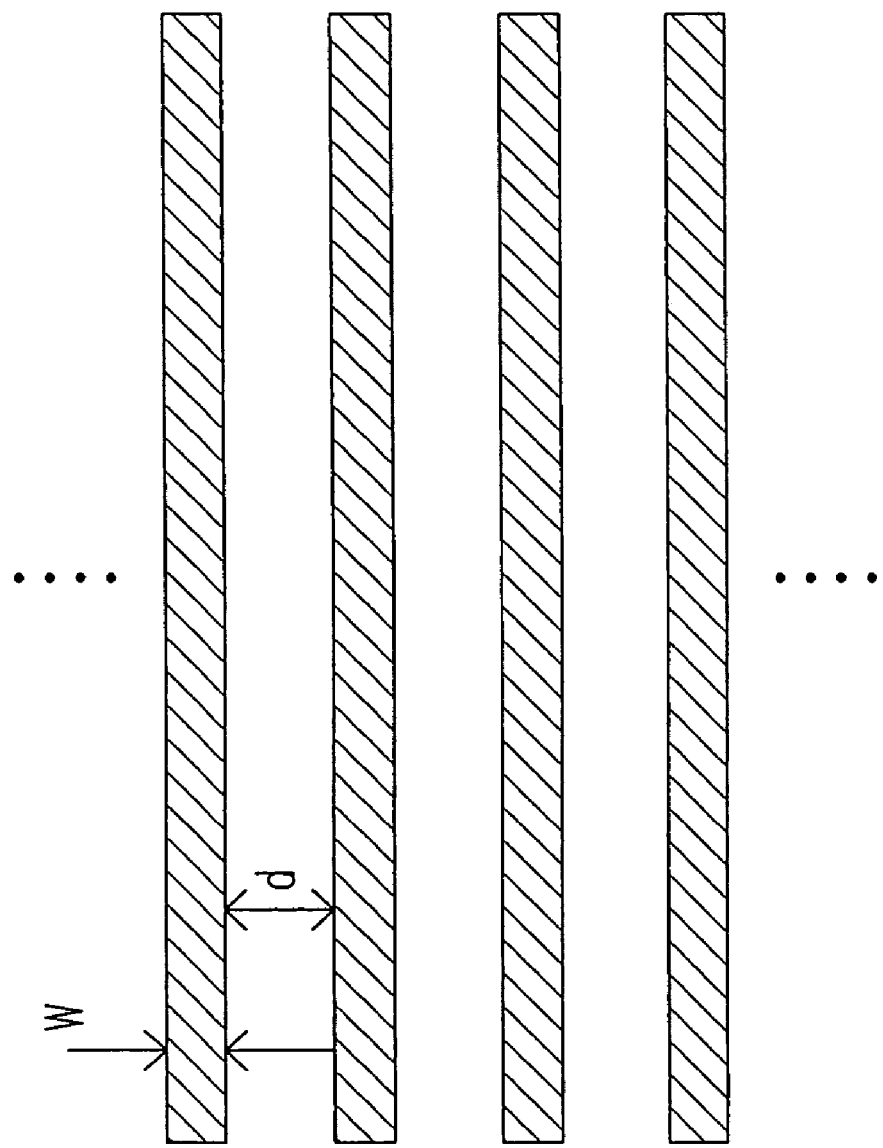
FIGS. 6(A) and 6(B) respectively shows the deployment of the fan out lines in single layer and in multi-layers of the substrate.
Figure 6B:
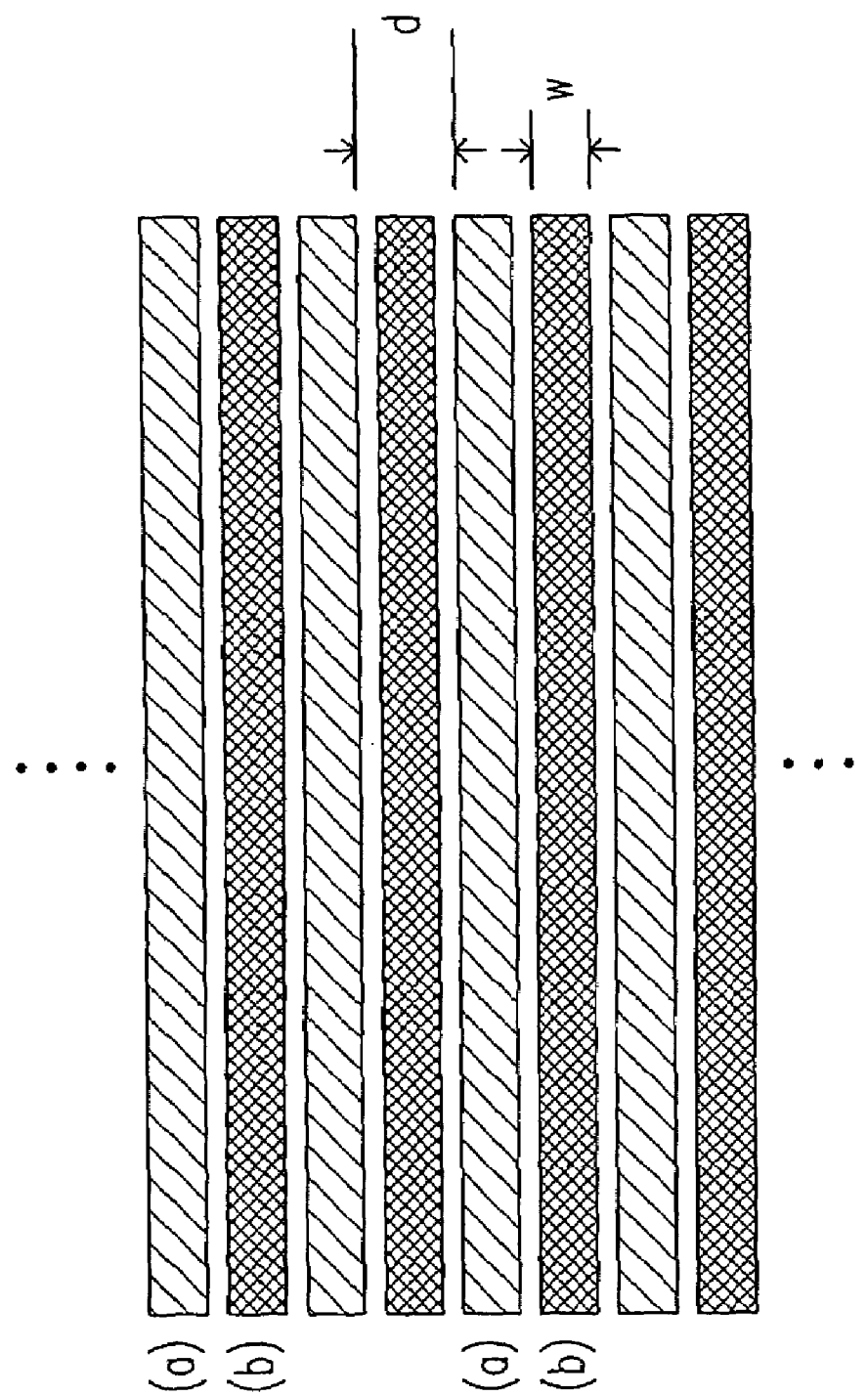

In an alternative embodiment of the present invention, the fan out lines 36, which are disposed in the edge of the substrate and used for connecting the readout lines 31-1, 31-2, . . . , and 31-N into the readout pads 35, can be further deployed in different layers of the substrate for effectively decreasing the required fringe area which is used for the deployment of those fan out lines. Please refer to FIGS. 6(A) and 6(B), which respectively shows the deployment of the fan out lines on single layer and in multi-layers of the substrate. Since the deployment of the fan out lines on single layer could be constrained by the line width w and the error tolerance of the process, the interval d between two adjacent fan out lines shall be maintained in a certain threshold value for guaranteeing the normal operation of the fan out lines, as can be seen from FIG. 6(A). However, if the fan out lines can be disposed on different layers of the substrate, the number of the fan out lines contained in the same area should be doubled or increased, as can be shown in FIG. 6(B). Although the number of the fan out lines contained in the same area of the substrate is increased, the interval d between two adjacent fan out lines on the same layer is still unchanged. Accordingly, the layout process of the fan out lines can be compatible as usual. Moreover, it should be noted that the different layers are made of insulator materials, such as a glass substrate.

Figure 7A:
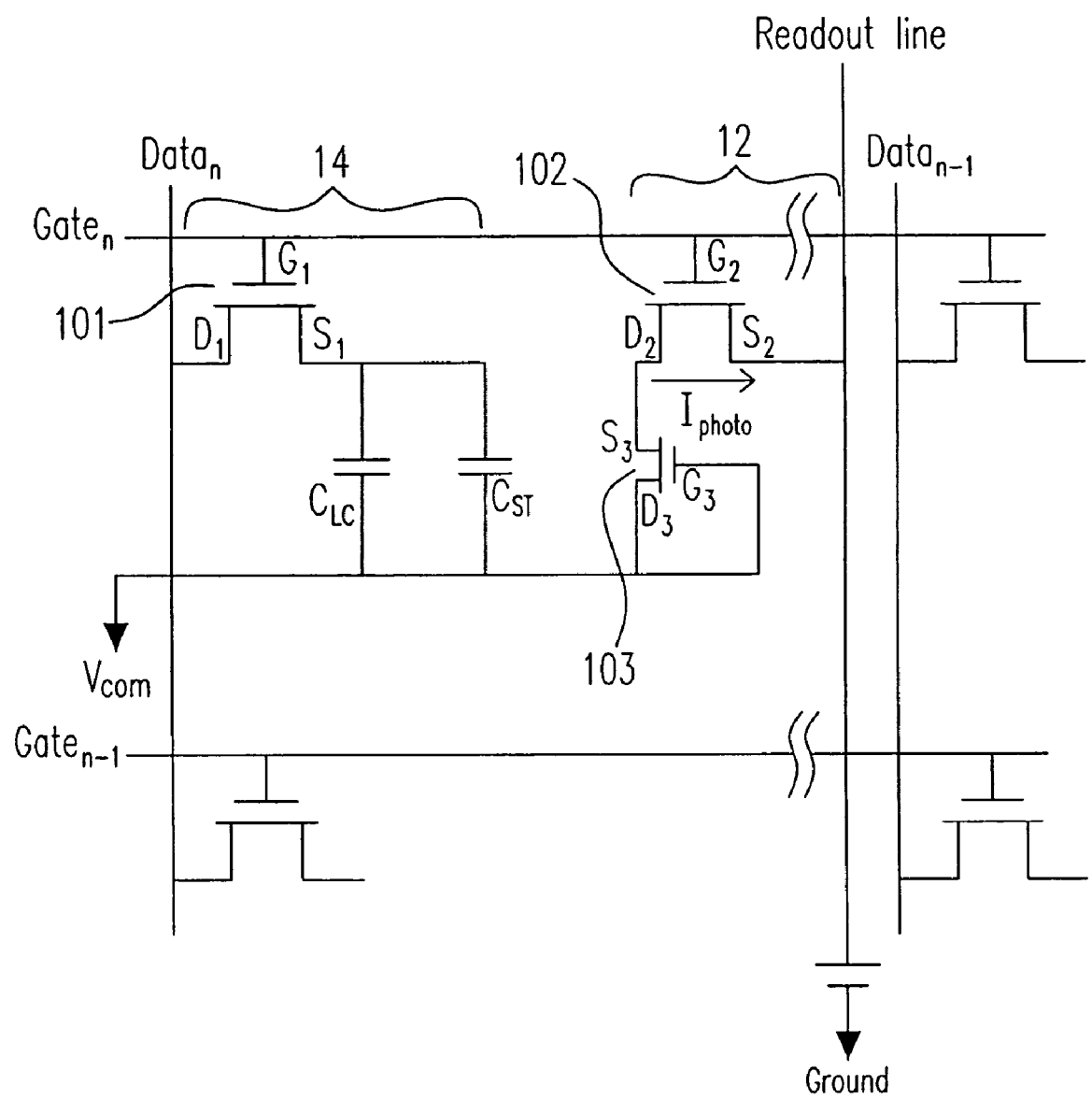
FIG. 7(A) schematically shows the equivalent circuit layout in a readout pixel of an input display according to a preferred embodiment of the present invention.

In addition to improving the layout of the readout pads and the deployment of the fan out lines, a further way to increase the aperture ratio of the input display is achieved by improving the circuit layout in the readout pixel of the input display. Please refer to FIG. 7(A), which schematically shows the equivalent circuit layout in a readout pixel of an input display according to a preferred embodiment of the present invention. In this embodiment, the circuit in each readout pixel still includes two main parts, i.e. a photo sensing element 12 and a normal pixel element 14. As can be seen from FIG. 7 (A), the normal pixel element 14 includes a first switching element 101 having a first drain electrode $D_1$ connecting to a first data line $Data_n$ of the readout pixel, a first gate electrode $G_1$ connecting to a first gate line $Gate_n$ of the readout pixel, and a first source electrode $S_1$ connecting to a common voltage $V_{com}$ of the readout pixel through a liquid crystal capacitor $C_{LC}$ and a storage capacitor $C_{ST}$ which are connected in parallel. As to the photo sensing element 12, it includes a second switching element 102 having a second gate electrode $G_2$ connecting to the first gate line $Gate_n$, a second drain electrode $D_2$ connecting to a third switching element 103, and a second source electrode $S_2$ connecting to the readout line. As can be seen from FIG. 7(A), the third switching element 103 is work as a photo sensor for generating a photo current transmitted through the second switching element 102 and then read out through the transmission of the readout line. The third switching element 103 having a third gate electrode $G_3$ and a third drain electrode $D_3$, both of which are connected to the common voltage $V_{com}$, and a third source electrode $S_3$ connected to the second drain electrode $D_2$ of the second switching element 102. In this embodiment, the layout area within the readout pixel is further decreased.

Figure 7B:
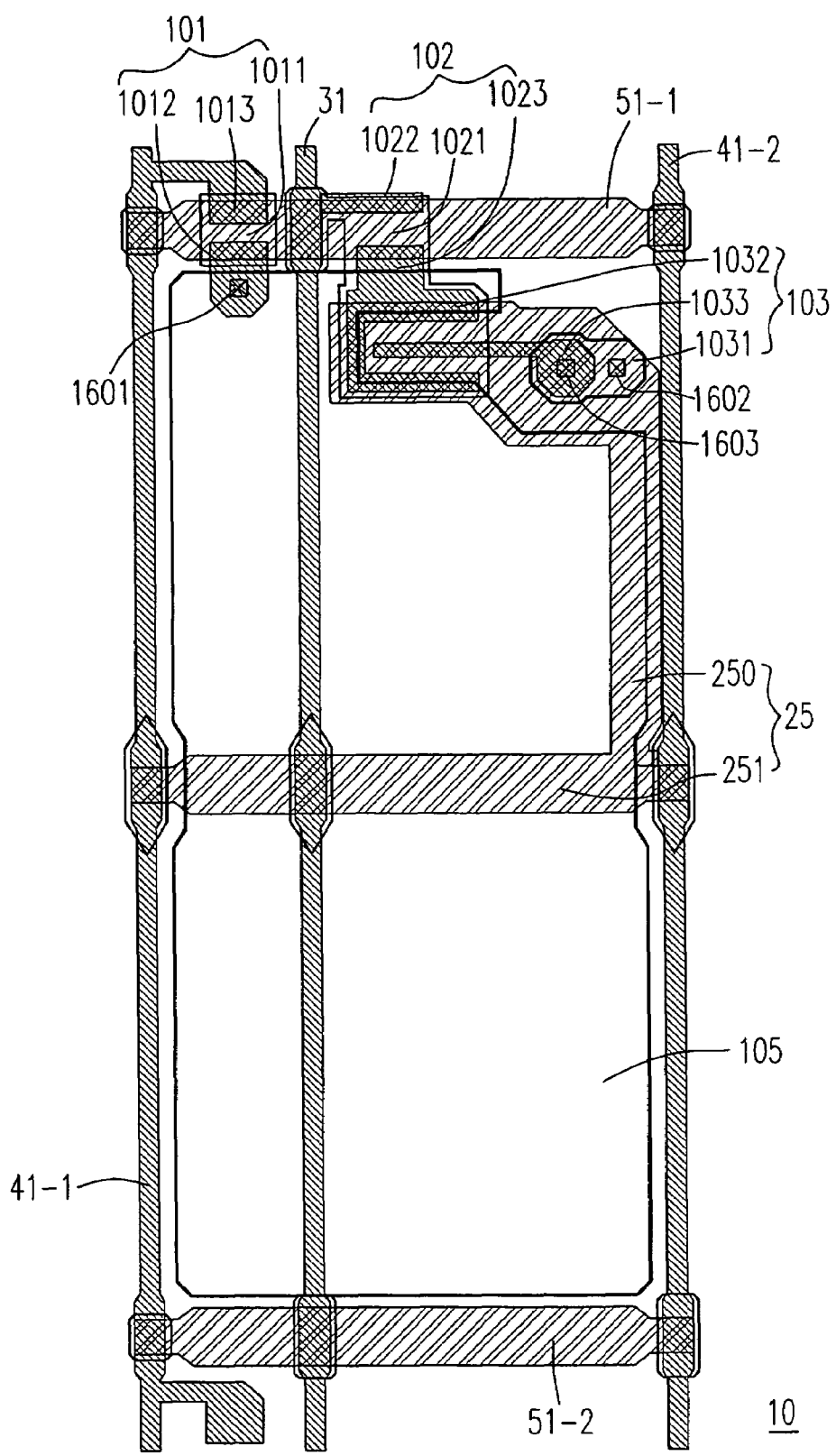
FIG. 7(B) shows a top view of a detailed layout in each readout pixel of an input display.

Moreover, please refer to FIG. 7(B), which shows a top view of a detailed layout in each readout pixel of an input display. The readout pixel 10 includes a first and a second gate lines 51-1, 51-2 for forming the top and bottom boundaries therefor, and a first and a second data lines 41-1, 41-2 of the readout pixel forming the right and left boundaries of the readout pixel 10. The gate lines and the data lines are intersected with each other for defining the scope of a readout pixel. Furthermore, inside the readout pixel, a readout line 31 is disposed adjacent to the second data line 41-1 in parallel and passing through the readout pixel 10 for transmitting a photo current to a processing circuit (not shown) of the input display. As can be seen from FIG. 7(B), a common electrode 25 has a transverse part 251 which is disposed between the first and second gate lines 51-1, 51-2. Furthermore, the common electrode 25 also has a longitudinal part 250 extending along an edge of the pixel electrode, and being possibly closed to and paralleled with the second data line 41-2 for possibly retaining the aperture ratio of the readout pixel 10. The storage capacitor $C_{ST}$ is formed by stacking the pixel electrode 105, a dielectric layer (not shown) and the common electrode 25. It also should be noted that the liquid crystal capacitor $C_{LC}$ is formed by the pixel electrode, the liquid crystal layer (not shown) and the counter electrode on the color filter side (not shown).

Moreover, as can be seen from FIG. 7(B), a first switching element 101 has a first drain electrode 1013 connected to the first data line 41-1, a first gate electrode 1011 disposed on the first gate line (i.e. using the gate line 51-1 as the first gate electrode 1011), and a first source electrode 1012 connected to a pixel electrode 105 through a first through hole 1601. In addition, a second switching element 102 uses the first gate line 51-1 as the second gate electrode 1021, and the second source electrode 1022 is directly connected to the readout line 31. On the other side, the second drain electrode 1023 of the second switching element 102 directly links up with the third source electrode 1032 of a third switching element 103. As can be seen from FIG. 7(B), the third gate electrode 1031 of the third switching element 103 and electrically connecting to an ITO layer 160 as shown in FIG. 7(D) via a second through hole 1602. The third drain electrode 1033 is connected with the ITO layer 160 via a third through hole 1603. Furthermore, the third source electrode 1032 of the third switching element 103 connects third switching element 103 to the readout line 31 through the second switching element 102.

In a preferred embodiment of the present invention, an improved layout in a readout pixel of an input display is provided. For a photo sensor (i.e. the third switching element 103) of the readout pixel, the photosensitivity thereof would be interfered by the voltage applied on the pixel electrode 105 (or the ITO layer 160), so that the part of the ITO layer 160 covering the second switching element 102 should be removed. However, since such part of the ITO layer 160 is removed, the light leakage of the liquid crystals near the third switching element 103 may occur. In general, the third gate electrode (gate metal layer) 1031 of the third switching element 103 would be extended widely enough for shielding the light leakage of the liquid crystals near the photo sensor. Nevertheless, the aperture ratio of the readout pixel is also reduced by such layout of the gate metal. Therefore, it is necessary to provide an improved layout in the readout pixel of the input display.

Figure 7C:
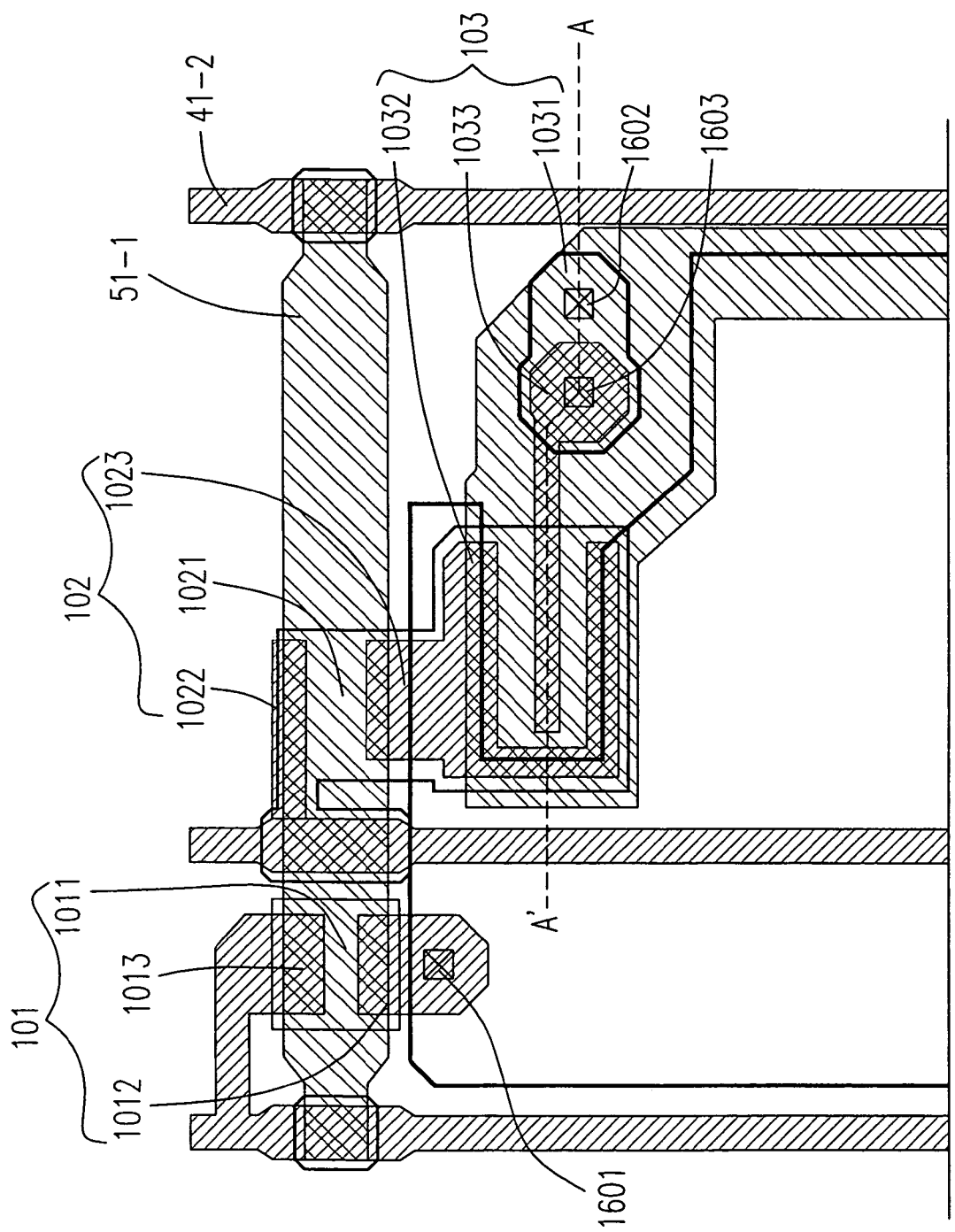
FIG. 7(C) shows an enlarged top view of a photo sensor in a readout pixel of an input display according to the readout pixel of FIG. 7(B)
Figure 7D:
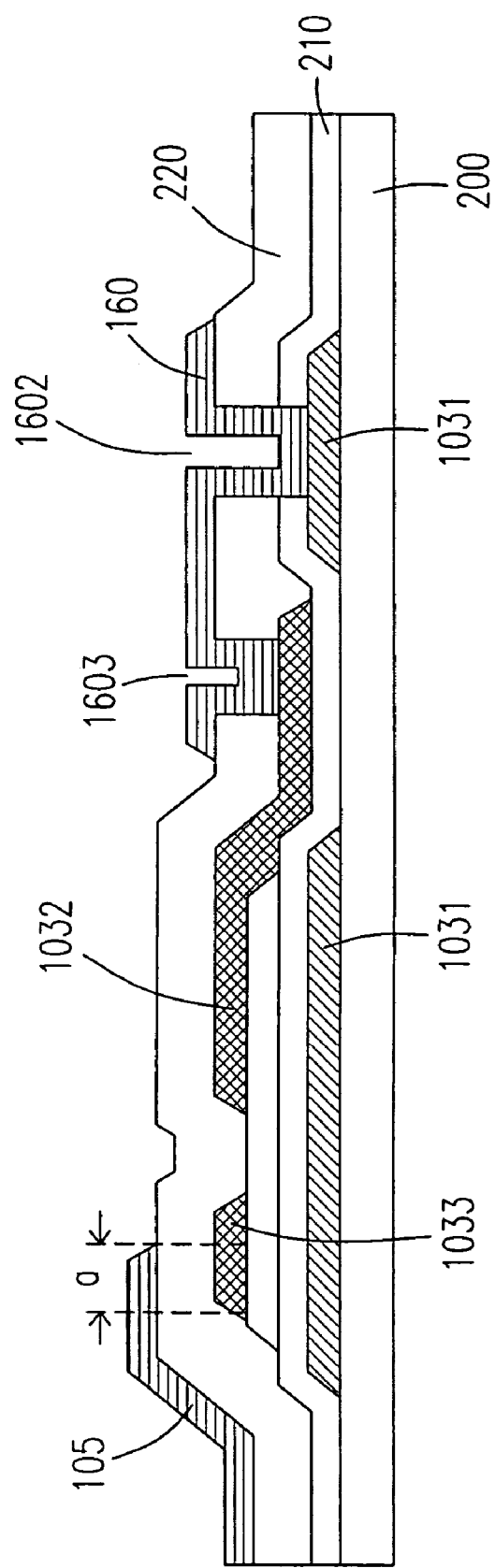
FIG. 7(D) is a cross-sectional view cut from the cross-sectional line A-A' of FIG. 7(C).

Please refer to FIGS. 7(C) and 7(D), which respectively shows an enlarged top view and a cross-sectional view of a second switching element 102 according to the readout pixel of FIG. 7(B). The readout pixel according to a preferred embodiment of the present invention is shown in FIG. 7(D). The third gate electrode 1031 of the third switching element 103 is formed on the substrate 200, and the source and drain electrodes 1032, 1033 of the third switching element 103 are formed on or above the gate insulating layer 210. Furthermore, the ITO layer 160 is disposed above the passivation layer 220.

As can be seen form FIGS. 7(C) and 7(D), since the pixel electrode 105 is extended and disposed on the third drain electrode 1033 of the third switching element as the dashed area "a" shown in FIG. 7(D), the light leakage problem near the area of the source and gate electrodes 1022, 1023 of the second switching element 102 can be reduced. Moreover, the area of the gate metal used for shielding the light leakage of the liquid crystals can be reduced, so that the aperture ratio of the pixel can be increased. The pixel electrode is designed to cover a part of the third gate electrode 1031, and it can cover a part of the third drain electrode 1033 as shown in FIG. 7(D) or a part of third source electrode 1032.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A liquid crystal display, comprising:
    a gate line and a data line intersecting with each other;
    a readout line arranged parallel with the data line;
    a first switching element having a first gate electrode connecting to the gate line, a first drain electrode connecting to the data line, and a first source electrode connecting to a liquid crystal capacitor and a storage capacitor, wherein the liquid crystal capacitor and the storage capacitor are connecting to a common voltage;
    a second switching element having a second gate electrode connecting to the gate line, a second drain electrode, and a second source electrode connecting to the readout line; and
    a third switching element having a third gate electrode and a third drain electrode, wherein the third gate electrode and the third drain electrode are connecting to a reference voltage, and a third source electrode connecting to the second drain electrode.

2. The liquid crystal display according to claim 1, wherein the common voltage and the reference voltage are interconnected with each other.

3. The liquid crystal display according to claim 1, wherein the liquid crystal capacitor is formed by stacking a pixel electrode, a liquid crystal layer and a counter electrode, and the storage capacitor is formed by stacking the pixel electrode, a dielectric layer and a common electrode.

4. The liquid crystal display according to claim 3, wherein the common electrode further comprises a longitudinal part disposed near an edge of the pixel electrode and extending along the data line.

5. The liquid crystal display according to claim 3, wherein the pixel electrode covering a part of the third drain electrode and a part of the third gate electrode.

6. The liquid crystal display according to claim 3, wherein the pixel electrode covering a part of the third gate electrode and a part of the third source electrode.

7. A liquid crystal display, comprising:
    a substrate having a plurality of first readout pixels and a plurality of second readout pixels formed thereon;
    a readout line pad arranged on a fringe area of the substrate;
    a gate line and a data line intersecting with each other;
    a first readout line paralleled with the data line and connecting the first readout pixels to the readout line pad; and
    a second readout line paralleled with the data line and connecting the second readout pixels to the readout line pad.

8. The liquid crystal display according to claim 7 further comprising a gate pad arranged on the fringe area of the substrate.

9. The liquid crystal display according to claim 7 further comprising a source pad arranged on the fringe area of the substrate.

10. The liquid crystal display according to claim 7, wherein one of the first readout pixels further comprising:

a first switching element having a first gate electrode connecting to the gate line, a first drain electrode connecting to the data line, and a first source electrode connecting to a liquid crystal capacitor and a storage capacitor, wherein the liquid crystal capacitor and the storage capacitor are connecting to a common voltage;

a second switching element having a second gate electrode connecting to the gate line, a second drain electrode, and a second source electrode connecting to the readout line; and a third switching element having a third gate electrode and a third drain electrode, wherein the third gate electrode and the third drain electrode are connecting to a reference voltage, and a third source electrode connecting to the second drain electrode.

11. The liquid crystal display according to claim 10, wherein the common voltage and the reference voltage are interconnected with each other.

12. A liquid crystal display, comprising:

a substrate including a first and a second insulating layers sequentially formed thereon and having a plurality of first readout pixels and a plurality of second readout pixels formed thereon;

a first fan-out line disposed on the first insulating layer and linking up with a first readout line connecting with the first readout pixels; and a second fan-out line disposed on the second insulating layer and linking up with a second readout line connecting with the second readout pixels.

13. The liquid crystal display according to claim 12, wherein the first insulating layer is a glass substrate.

14. The liquid crystal display according to claim 12, wherein the first and the second fan-out lines are arranged approaching to an edge of the substrate.

15. The liquid crystal display according to claim 12 further comprising a readout line pad arranged on a fringe area of the substrate.

16. The liquid crystal display according to claim 12, wherein one of the first readout pixels further comprises:

a first switching element having a first gate electrode connecting to the gate line, a first drain electrode connecting to the data line, and a first source electrode connecting to a liquid crystal capacitor and a storage capacitor both connecting to a common voltage;

a second switching element having a second gate electrode connecting to the gate line, a second drain electrode, and a second source electrode connecting to the readout line; and a third switching element having a third gate electrode and a third drain electrode, wherein the third gate electrode and the third drain electrode are connected to a reference voltage, and a third source electrode connected to the second drain electrode.

17. The liquid crystal display according to claim 16, wherein the common voltage and the reference voltage are interconnected with each other.

18. A liquid crystal display, comprising:

a gate line and a data line intersecting with each other;

a readout line arranged parallel with the data line;

a first switching element having a first gate electrode connecting to the gate line, a first drain electrode connecting to the data line, and a first source electrode connecting to a pixel electrode;

a second switching element including a second gate electrode linking up with the gate line, a second drain electrode, and a second source electrode linking up with the readout line; and a third switching element connecting to the second drain electrode and containing a third gate electrode, a third drain electrode, and a third source electrode;

wherein the pixel electrode covering a part of the third gate electrode.

19. The liquid crystal display according to claim 18, wherein the pixel electrode covering a part of the third drain electrode.

20. The liquid crystal display according to claim 18, wherein the pixel electrode covering a part of the third source electrode.

* * * * *